United States Patent [19]

Higashi

[11] Patent Number: 5,862,587
[45] Date of Patent: Jan. 26, 1999

[54] LINE OF ELECTRONIC PART MOUNTING APPARATUSES AND METHOD FOR MOUNTING ELECTRONIC PARTS

[75] Inventor: Masayuki Higashi, Fukuoka, Japan

[73] Assignee: Matsushita Electric Industrial Co., Ltd., Osaka, Japan

[21] Appl. No.: 991,266

[22] Filed: Dec. 16, 1997

[30] Foreign Application Priority Data

Dec. 20, 1996 [JP] Japan .................................. 8-341034

[51] Int. Cl.$^6$ .................................................. H05K 3/30
[52] U.S. Cl. ............................ 29/832; 29/740; 29/742; 29/836
[58] Field of Search .......................... 29/712, 740, 741, 29/742, 743, 832, 834, 836

[56] References Cited

U.S. PATENT DOCUMENTS 5,317,802  6/1994  Jyoko .......................................... 29/832

*Primary Examiner*—Peter Vo
*Assistant Examiner*—Rick Kiltae Chang
*Attorney, Agent, or Firm*—Ratner & Prestia

[57] ABSTRACT

The present invention presents an electronic part mounting apparatus line and electronic part mounting method of favorable line balance and high productivity, which comprises a step of acquiring the working time in plural electronic part mounting apparatuses, and a step of lowering the mounting rate of common parts A–C in the electronic part mounting apparatuses longer in working time, if there is a longer working time out of the allowable range than the other acquired working times, and raising the mounting rate of common parts in all or some of the other electronic part mounting apparatuses than these electronic part mounting apparatuses taking a longer working time.

2 Claims, 3 Drawing Sheets

LINE OF ELECTRONIC PART MOUNTING APPARATUSES AND METHOD FOR MOUNTING ELECTRONIC PARTS

BACKGROUND OF THE INVENTION

The present invention relates to a line including plural electronic part mounting apparatuses arranged in series for mounting electronic parts on a substrate, and a method for mounting electronic parts.

It is known to mount electronic parts on a substrate by operating plural electronic part mounting apparatuses simultaneously each of which allots mounting work of some parts. It is very convenient because it is not required to cope with all kinds of parts by one electronic part mounting apparatus alone.

In such apparatus line of electronic part mounting apparatuses, however, some of the plural mounting apparatuses may finish the assigned parts mounting work in a short time, while others may take a longer working time. That is, the working times of the electronic part mounting apparatuses may not be balanced in the mounting apparatus line. Considering the operation in the entire mounting apparatus line, one substrate is finished by the longest working time of their working times.

As a countermeasure, by simulating prior to mounting, it may be considered to distribute the kinds of parts and mounting rate so that the working time of each mounting apparatus may be nearly equal.

Nevertheless, in actual mounting, it is often different from the result of simulation, and the imbalance of working time of each mounting apparatus cannot be suppressed sufficiently. As a result, the productivity tends to be lowered due to the long working time of some of the mounting apparatuses.

Still more, to do simulation, models of various electronic part mounting apparatuses must be built up in the computer, and it takes a long time in preparation.

It is hence an object of the invention to present an apparatus line of electronic part mounting apparatuses and a method for mounting electronic parts excellent in line balance and high in productivity.

SUMMARY OF THE INVENTION

An apparatus line of electronic part mounting apparatuses of the invention comprises plural electronic part mounting apparatuses arranged mutually in series, conveying means for conveying a substrate among the plural electronic part mounting apparatuses, a part mounting line controller for controlling the plural electronic part mounting apparatuses, and communication means for transmitting information between the part mounting line controller and the plural electronic part mounting apparatuses. Each of the plural electronic part mounting apparatuses includes a part mounting mechanism for mounting electronic parts on a substrate, and a parts feeder for feeding exclusive parts not mounted by other electronic part mounting apparatuses and common parts mounted also by other electronic part mounting apparatuses to the part mounting mechanism. The part mounting line controller monitors the working time per single substrate or plural substrates in each one of the electronic part mounting apparatuses, and controls through the communication means so as to lower the mounting rate of common parts in the electronic part mounting apparatus longer in working time than other electronic part mounting apparatuses, and raise the mounting rate of common parts in all or some of other electronic part mounting apparatuses than the electronic part mounting apparatus.

A method for mounting electronic parts of the invention comprises a step of acquiring the working time in each one of the electronic part mounting apparatuses, and a step of lowering the mounting rate of common parts in the electronic part mounting apparatuses longer in working time, if there is a longer working time out of the allowable range than the other acquired working times, and raising the mounting rate of common parts in all or some of other electronic part mounting apparatuses than the electronic part mounting apparatus taking a longer working time.

As the substrate passes through the plural electronic part mounting apparatuses, parts are being mounted, and when passing through the entire line of the electronic part mounting apparatuses, mounting of parts on this substrate is complete. The plural electronic part mounting apparatuses operate parallel to mount both exclusive parts and common parts on each substrate, and finish the assigned parts mounting in a specific working time. Herein, as mentioned above, the working time of each electronic part mounting apparatus is not always uniform. Accordingly, the working time of the electronic part mounting apparatuses is measured and compared.

In the electronic part mounting apparatus taking a longer working time, the mounting rate of common parts is lowered and the task is lessened. In the next process, therefore, the working time of the electronic part mounting apparatus is shortened.

On the other hand, the lessened task is assigned among other electronic part mounting apparatuses, and the working time of the assigned electronic part mounting apparatuses is longer in the next process. If the working time is thus extended, however, only the working time is nearly equal to the changed working time of the electronic part mounting apparatus lessened in the task, and only the waiting time of the electronic part mounting apparatuses is shortened.

That is, from the viewpoint of the entire electronic part mounting apparatus line, all electronic part mounting apparatuses finish the assigned parts mounting almost in uniform working time, and the line balance is improved and the productivity is enhanced. Moreover, the mounting rate of common parts is corrected whenever the line balance is about to be broken, and it is possible to react flexibly if an expected event should occur in any electronic part mounting apparatus. Although the mounting rate is corrected, what is corrected relates only to the common parts of the electronic part mounting apparatuses. From the standpoint of the substrate, it does not matter which electronic part mounting apparatus is responsible for mounting a specific part, and it is enough only when all necessary parts are mounted when passing through the entire electronic part mounting apparatus line, and hence there is no problem.

DESCRIPTION OF THE PREFERRED EMBODIMENTS

Figure 1:
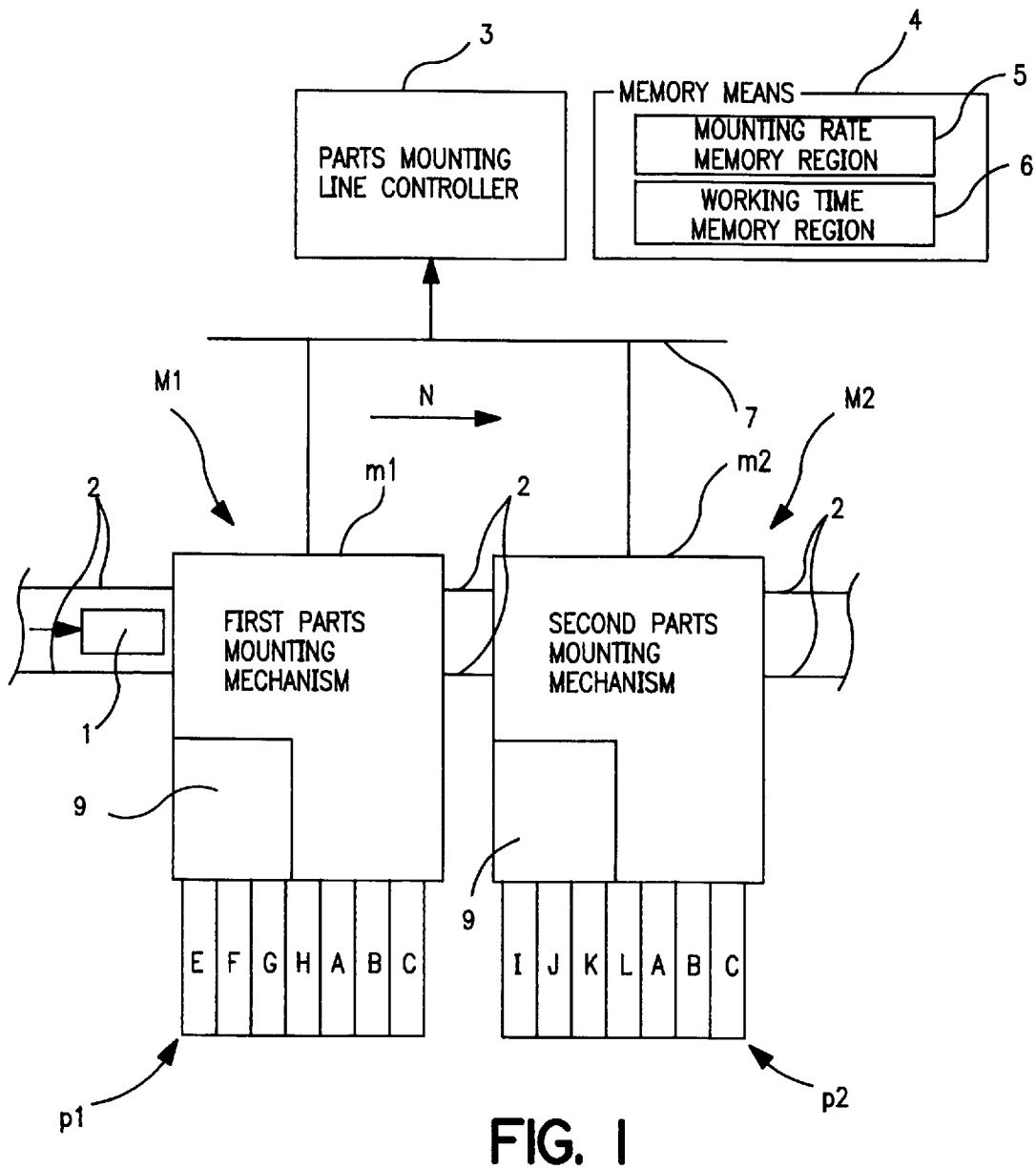
FIG. 1 is a block diagram of an apparatus line of electronic part mounting apparatuses in an embodiment of the invention.

In FIG. 1, arrow N indicates the conveying direction of a substrate 1. In this embodiment, two electronic part mounting apparatuses (first electronic part mounting apparatus M1 and second electronic part mounting apparatus M2) are arranged in series along the conveying direction N to compose an apparatus line. One substrate 1 is first sent into the first electronic part mounting apparatus M1 by a conveyor 2 which is conveying means, and after electronic parts are mounted by the first mounting apparatus M1, it is sent into the second electronic part mounting apparatus M2 by the conveyor 2. After electronic parts are mounted by the second mounting apparatus M2, it is discharged into next process from the apparatus line by the conveyor 2.

The first electronic part mounting apparatus M1 comprises a first parts feeder p1 for feeding common parts A–C and exclusive parts E–H, and a first part mounting mechanism M1 for picking up electronic parts from the first parts feeder p1 and mounting them on the substrate 1. Similarly, the second electronic part mounting apparatus M2 comprises a second parts feeder p2 for feeding common parts A–C and exclusive parts I–L, and a second parts mounting mechanism m2 for picking up electronic parts from the second parts feeder p2 and mounting them on the substrate 1. Herein, the common parts A–C are provided in both first parts feeder p1 and second parts feeder p2, and therefore can be mounted by both first mounting apparatus M1 and second mounting apparatus M2. On the other hand, the exclusive parts E–H are provided only in the first parts feeder p1, and hence cannot be mounted by other than the first mounting apparatus M1. Likewise, the exclusive parts I–L can be mounted only by the second mounting apparatus M2.

A part mounting line controller 3 is to control the first mounting apparatus M1 and second mounting apparatus M2, and includes memory means 4 comprising a memory. The memory means 4, concerning common parts A–C, includes a mounting rate memory region 5 for storing the mounting rate, that is, the number of common parts to be mounted on one substrate respectively by the first mounting apparatus M1 and second mounting apparatus M2, and a working time memory region 6 for storing the working time required in one process respectively by the first mounting apparatus M1 and second mounting apparatus M2. The first mounting apparatus M1, second mounting apparatus M2, and part mounting line controller 3 are connected through communication means 7, so that information about mounting operation can be transmitted and received.

The first electronic part mounting apparatus M1 and second electronic part mounting apparatus M2 incorporate working time measuring means 9 for measuring the working time per one substrate respectively, and when mounting of parts on the substrate is finished, it is read by the part mounting line controller 3 through the communication means 7. The read working time is stored in the working time memory region 6 by the part mounting line controller 3. In the mounting rate memory region 5, a proper initial value is entered preliminarily, and the first mounting apparatus M1 and second mounting apparatus M2 individually incorporate a mounting program created on the basis of this initial value.

Figure 2:
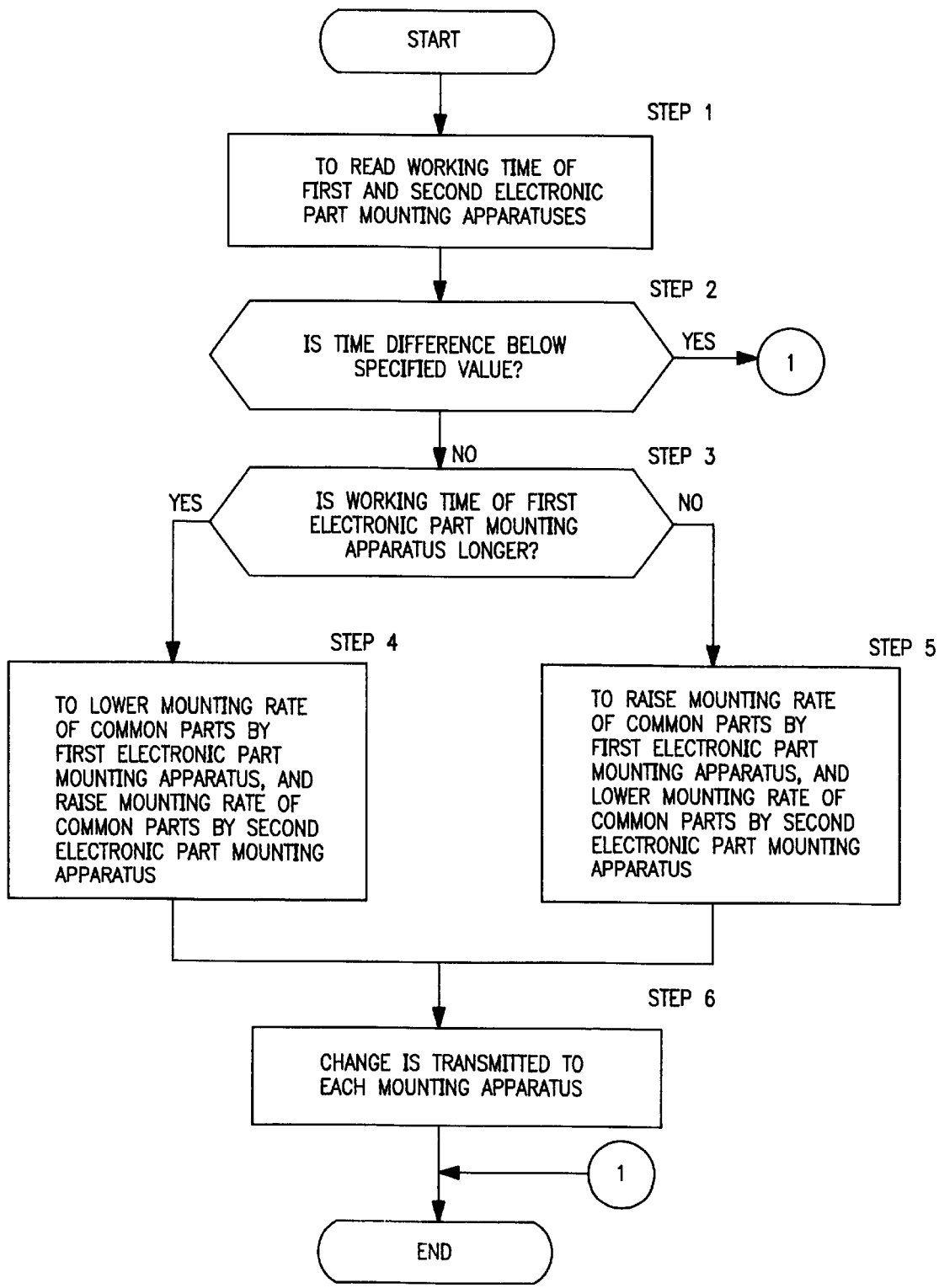
FIG. 2 is a flowchart for explaining processing of the part mounting line controller shown in FIG. 1.

Referring to FIG. 2, the processing procedure of the part mounting line controller 3 is described below.

To begin with, a substrate 1 is sent into the first electronic part mounting apparatus M1 and second electronic part mounting apparatus M2. Supposing mounting of parts is completed in both first mounting apparatus M1 and second mounting apparatus M2, the part mounting line controller 3 inquires the working time to the first mounting apparatus M1 and second mounting apparatus M2 through the communication means 7 (step 1), and the acquired two working times are stored in the working time memory region 6.

Consequently, it is judged if the difference of two working times is within specific values (values for determining the allowable range, being set empirically) or not (step 2). Herein, if the difference is not more than the allowable value, the first mounting apparatus M1 and second mounting apparatus M2 are finishing the job nearly in the same time. Therefore, the line balance is favorable, and the mounting rate is unchanged.

If exceeding the allowable value, on the other hand, a non-ignorable waiting time occurs in either the first mounting apparatus M1 or the second mounting apparatus M2, and the line balance is poor.

If the working time of the first mounting apparatus M1 is longer, referring to the mounting rate memory region 5, the present value is acquired, and the mounting rate of common parts A–C in the first mounting apparatus M1 is lowered. And the task of the first mounting apparatus M1 is lessened, and the rate of common parts A–C of the second mounting apparatus M2 is raised by the lessened task portion (steps 3 and 4). The corrected value is stored in the mounting rate memory region 5, and is transmitted to the first mounting apparatus M1 and second mounting apparatus M2 (step 6).

To the contrary, if the working time of the second mounting apparatus M2 is longer, correcting reversely to the above case (steps 3 and 5), the corrected mounting rate is transmitted to the first mounting apparatus M1 and second mounting apparatus M2. Receiving the corrected mounting rate, the first mounting apparatus M1 revises the mounting program according to this mounting rate, and when a new substrate is delivered, the parts are mounted according to the revised program. The second mounting apparatus M2, after mounting parts on all substrates on which parts are mounted by the first mounting apparatus M1 before revision of the mounting program, revises the mounting program according to the revised mounting rate, and mounts parts according to the revised mounting program when substrates on which parts are mounted by the first mounting apparatus M1 after revision of the mounting program are sent in.

An embodiment of correction is described below according to FIG. 3 (a) and FIG. 3 (b).

Figure 3A:
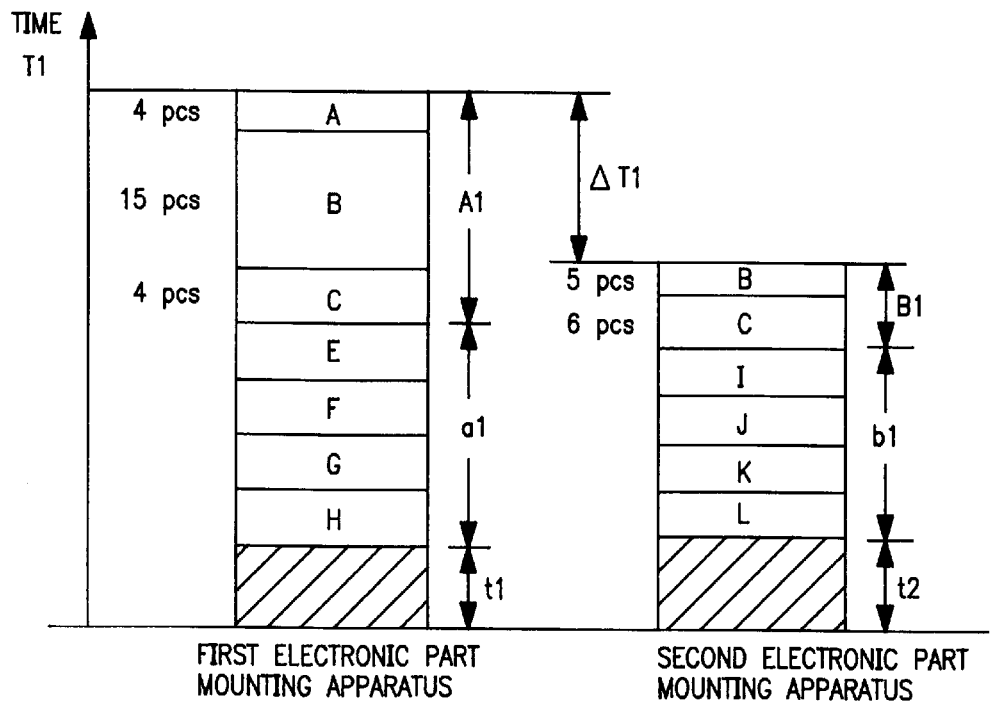
FIG. 3 (*a*) and FIG. 3 (*b*) are diagrams for explaining the initial mounting rate and corrected mounting rate respectively, in an embodiment of the invention.
Figure 3B:
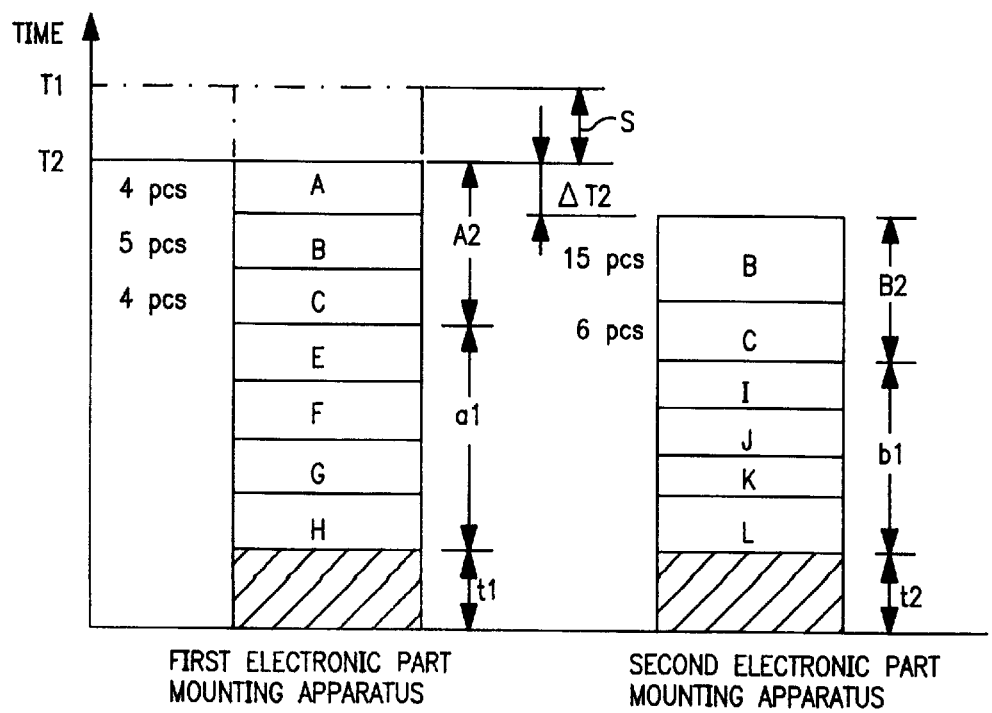

Suppose the line balance is poor as shown in FIG. 3 (a) when mounting parts at the initial mounting rate (initial value). At this time, the working time of the first mounting apparatus M1 is T1. In breakdown, time A1 is spent by the mounting rate of common parts A (4 pieces), B (15 pieces), and C (4 pieces). It also takes time a1 for exclusive parts E–H and time t1 loading and unloading of substrate 1.

The working time of the second mounting apparatus M2 is shorter than T1 by time difference ΔT1, and it takes time B1 for common parts B (5 pieces) and C (6 pieces), and time b1 for exclusive parts I–L, and time t2 for loading and unloading of substrate 1.

At this time, the cycle time of the entire electronic part mounting apparatus line is time T1. That is, although the second mounting apparatus M2 finishes mounting earlier, the first mounting apparatus M1 is still in the process of mounting at this finishing time, and next substrate 1 cannot be sent into the first mounting apparatus M1 until mounting is over in the first mounting apparatus M1. In other words, if the line balance is poor, and there is an electronic part mounting apparatus taking a longer working time, the cycle time of the entire electronic part mounting apparatus line is extended by this portion.

In such a case, the part mounting line controller 3 corrects as shown in FIG. 3 (b) according to the flowchart in FIG. 2.

In this example, the common parts B of the first mounting apparatus M1 is decreased by 10 pieces, and they are added to the common parts of the second mounting apparatus M2 to be 15 pieces in total. Of course, this is only an example of correction of mounting rate, and not limited to the common parts B, other common parts may be also corrected at the same time.

As a result, the time of the first mounting apparatus M1 for common parts A–C is curtailed by A2, and the working time decreases from T1 to T2. In this example, even after revision, the working time of the second mounting apparatus M2 is shorter than that of the first mounting apparatus M1 by ΔT2. Then, as clear from FIG. 3 (b), the longer working time (cycle time) of the working times of the first mounting apparatus M1 and second mounting apparatus M2 is time T2, which is shorter by time S as compared with the case before revision in FIG. 3 (a), so that the productivity is enhanced.

Flowchart processing in FIG. 2 by the part mounting line controller 3 is done upon every completion of mounting of specified number of parts (10 to 20 pieces) on the substrate. In this embodiment, the mounting rate is corrected by comparing the working time per substrate in each electronic part mounting apparatus, but the working time may be also based on the cumulative time of mounting parts on plural substrates or the average time.

As clear from the description herein, according to the invention, the line balance can be corrected relatively easily and adequately in the line of electronic part mounting apparatuses, and the wasteful waiting time is curtailed and the productivity is enhanced.

What is claimed is:

1. An assembly line having a plurality of electronic part mounting apparatuses arranged in series, each of said plurality of apparatuses having a respective working time, wherein at least a first of said plurality of apparatuses mount ones of a plurality of electronic parts on a substrate, and wherein at least a second of said plurality of apparatuses mount others of said plurality of parts on said substrate, comprising:

conveying means for conveying a substrate along said plurality of electronic part mounting apparatuses;

measurement means for measuring said working time for said substrate in each one of said electronic part mounting apparatuses, wherein said working time is an interval of time in which mounting said plurality of parts by each one of said plurality of mounting parts apparatuses is completed; and a part mounting controller having a mounting rate memory region and a working time memory region in which said working time is stored, said controller monitoring a respective number of parts mounted by each one of said plurality of apparatuses, said controller a) lowering said respective number of parts mounted in ones of said plurality of apparatuses if said respective working time of ones of said plurality of apparatuses is greater than said respective working time of others of said plurality of apparatuses, and b) raising said respective number of parts mounted in all or some others of said plurality of apparatuses so that the working time of each of said plurality of apparatuses becomes closer to equal.

2. A method for finish mounting a plurality of electronic parts on a substrate, the method comprising the steps of:

a) conveying said substrate among a plurality of electronic part mounting apparatuses arranged in series;

b) mounting ones of said plurality of parts by at least a first of said plurality of electronic part mounting apparatuses;

c) mounting others of said plurality of parts by at least a second of said electronic part mounting apparatuses;

d) measuring a respective working time in each one of said plurality of electronic part mounting apparatuses, wherein said working time is an interval of time in which mounting said plurality of parts by each one of said plurality of mounting parts apparatuses is completed;

e) monitoring a respective number of parts mounted by each one of said plurality of apparatuses;

f) comparing said respective working time of ones of said plurality of apparatuses and said respective working time of others of said plurality of apparatuses;

c) lowering said respective number of parts mounted in ones of said plurality of apparatuses if said respective working time of ones of said plurality of apparatuses is greater than said respective working time of others of said plurality of apparatuses; and g) raising said respective number of parts mounted in all or some others of said plurality of apparatuses so that the working time of each of said plurality of apparatuses becomes closer to equal.

\* \* \* \* \*